(12) United States Patent
Tung et al.

(10) Patent No.: US 8,534,659 B2
(45) Date of Patent: Sep. 17, 2013

(54) SUBSTRATE CARRIER AND APPLICATIONS THEREOF

(75) Inventors: Chun-Hsing Tung, Changhua County (TW); Fei-Tzu Lin, Miaoli County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/323,941

(22) Filed: Dec. 13, 2011

(65) Prior Publication Data

US 2013/0149870 A1    Jun. 13, 2013

(51) Int. Cl.
*B25B 1/00* (2006.01)

(52) U.S. Cl.
USPC .............................................. 269/903; 269/21

(58) Field of Classification Search
USPC ................... 269/903, 21, 20, 287; 438/758
See application file for complete search history.

(56) References Cited

U.S. PATENT DOCUMENTS

| 4,545,115 | A | * | 10/1985 | Bauer et al. | 438/570 |
| 5,273,615 | A | * | 12/1993 | Asetta et al. | 156/750 |
| 5,704,599 | A | * | 1/1998 | Slothower | 269/21 |
| 6,286,825 | B1 | * | 9/2001 | Tseng et al. | 269/287 |
| 6,764,258 | B1 | * | 7/2004 | Akre | 409/219 |
| 8,322,696 | B2 | * | 12/2012 | McClaran | 269/21 |
| 8,322,700 | B2 | * | 12/2012 | Saberton et al. | 269/296 |

* cited by examiner

*Primary Examiner* — Lee D Wilson
(74) *Attorney, Agent, or Firm* — Ding Yu Tan

(57) ABSTRACT

A substrate carrier for performing a deposition process comprises a supporting element and a cover element. The supporting element having a through hole is used to carry a substrate. The cover element is removably engaged with the supporting element, so as to secure the substrate therebetween and expose a deposition surface of the substrate from the through hole.

7 Claims, 3 Drawing Sheets

SUBSTRATE CARRIER AND APPLICATIONS THEREOF

FIELD OF THE INVENTION

The present invention relates to a tool and an apparatus for fabricating a semiconductor device and a method applying thereof, and more particularly to a substrate carrier, an apparatus for performing a deposition process and a method applying thereof.

BACKGROUND OF THE INVENTION

A backside metal process is one of the key process steps for the fabrication of integrated semiconductor devices. Conventionally, a metal sputtering process or an electron beam deposition (EBD) process may be performed to form a metal film on the backside surface of a wafer in order to improve the heat depression problems of the integrated circuit (IC) formed on the active surface of the wafer opposite to its backside surface. In some cases, the metal film may further provide electrical connection functions to improve the wiring integrity of the IC.

In some typical backside metal process, at least one wafer is disposed on a carrier, and the active surface and backside surface of the wafer are exposed. The carrier is then disposed in a cabinet of a deposition apparatus pervaded by a metal source, whereby a metal film can be formed on the backside surface of the wafer. However, there are still some drawbacks, for example, since the backside metal process is carried out without shielding the active surface of the wafer, thus some metal ions may be deposited thereon, and these metal ions may be further oxidized to contaminate the active surface, such that wafer may be smudged and active surface discoloration may occur. These problems may get worse, especially in the course of some thermal reactions or at the time of vacuum release.

Therefore, there is a need of providing an advanced substrate carrier, an apparatus for performing a deposition process and a method applying thereof in order to prevent wafer discolored or smudged and improve the production yield of the integrated semiconductor devices formed on the active surface of the wafer.

SUMMARY OF THE INVENTION

Therefore, one aspect of the present invention is to provide a substrate carrier for performing a deposition process, wherein the substrate carrier comprises a supporting element and a cover element. The supporting element used to carry a substrate has a through hole. The cover element is removably engaged with the supporting element to secure the substrate therebetween and expose a deposition surface of the substrate from the through hole.

In one embodiment of the present invention, the supporting element comprises a base and a first annular flange, wherein the through hole penetrates through the base, and the first annular flange protrudes from the base and surrounds the through hole. In one embodiment of the present invention, the first annular flange has a size substantially greater than that of the substrate, and the through hole has a size substantially less than that of the substrate.

In one embodiment of the present invention, the cover element comprises a shielding plate and a second annular flange. The shielding plate has a cover surface used to confront the substrate. The second annular flange protrudes from the shielding plate, surrounds the cover surface and has a size substantially greater than that of the first annular flange.

In one embodiment of the present invention, when the cover element is engaged with the supporting element to secure the substrate therebetween, the second annular flange may get in touch with the base, and whereby a space substantially airtight can be defined between the cover element, the supporting element and the substrate.

In one embodiment of the present invention, the substrate carrier further comprises a handle and a holding rod, wherein the handle is fixed on the edge of the supporting element, and the holding rod is fixed on a surface of the cover element opposite to the cover surface. In one embodiment of the present invention, the handle is a protruding portion extending from the supporting element, and the holding rod is a protruding portion extending from the cover element.

In one embodiment of the present invention, the substrate carrier further comprises a fastening element used to secure the cover element on the supporting element.

Another aspect of the present invention is to provide an apparatus for performing a deposition process, wherein the apparatus comprises a cabinet, a substrate carrier and a deposition source. The substrate carrier is disposed in the cabinet and comprises a supporting element and a cover element. The supporting element having a through hole is used to carry a substrate. The cover element is removably engaged with the supporting element to secure the substrate therebetween and expose a deposition surface of the substrate from the through hole. The deposition source used to provide a deposition vapor is disposed in the cabinet.

In one embodiment of the present invention, the supporting element comprises a base and a first annular flange, wherein the through hole penetrates through the base, and the first annular flange protrudes from the base and surrounds the through hole. In one embodiment of the present invention, the first annular flange has a size substantially greater than that of the substrate, and the through hole has a size substantially less than that of the substrate.

In one embodiment of the present invention, the cover element comprises a shielding plate and a second annular flange. The shielding plate has a cover surface used to confront with the substrate. The second annular flange protrudes from the shielding plate, surrounds the cover surface and has a size substantially greater than that of the first annular flange.

In one embodiment of the present invention, when the cover element is engaged with the supporting element to secure the substrate therebetween, the second annular flange can get in touch with the base, and whereby a space substantially airtight can be define between the cover element, the supporting element and the substrate.

In one embodiment of the present invention, the substrate carrier further comprises a handle and a holding rod, wherein the handle is fixed on the edge of the base, and the holding rod is disposed on a surface of the cover element opposite to the cover surface. In one embodiment of the present invention, the handle is a protruding portion extending from the supporting element, and the holding rod is a protruding portion extending from the cover element.

In one embodiment of the present invention, the substrate carrier further comprises a fastening element used to secure the cover element on the supporting element.

A deposition method comprises steps as follows: An apparatus for performing a thin-film deposition process is firstly provided, wherein the apparatus comprises a cabinet, a substrate carrier and a deposition source. The substrate carrier is disposed in the cabinet and comprises a cover element and a supporting element having a through hole. The deposition source is disposed in the cabinet. A substrate is subsequently disposed on the supporting element in order to make a deposition surface of the substrate exposed from the through hole. The cover element is then engaged with the supporting element to secure the substrate therebetween. Next a deposition vapor is provided from the deposition source to get in touch with the deposition surface.

In one embodiment of the present invention, the substrate is a wafer, and the deposition vapor is a metal source vapor.

In one embodiment of the present invention, the step for engaging the cover element with the supporting element comprises steps of defining a space substantially airtight between the cover element, the supporting element and the substrate. In one embodiment of the present invention, the deposition surface is a backside surface of the wafer, and the space is defined by the supporting element, the cover element and an active surface of the wafer.

In accordance with aforementioned embodiments, the present invention provides a substrate carrier used for performing a deposition. The substrate carrier comprises a supporting element and a cover element, when the supporting element and the cover element are engaged with each other; a substrate can be secured therebetween. By using the cover element as a shielding mask to prevent the surfaces of the substrate which are undesired to be subject to a deposition process from getting in touch with the deposition vapor, the undesired contaminations and discoloration occurring on the substrate may be avoided and the production yield of the integrated semiconductor devices formed on the substrate may be improved.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

A substrate carrier, an apparatus for performing a thin-film deposition process and a method applying thereof are provided to prevent the surfaces of a substrate which are undesired to be subject to a deposition process from discoloration due to the contamination of a deposition vapor. The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
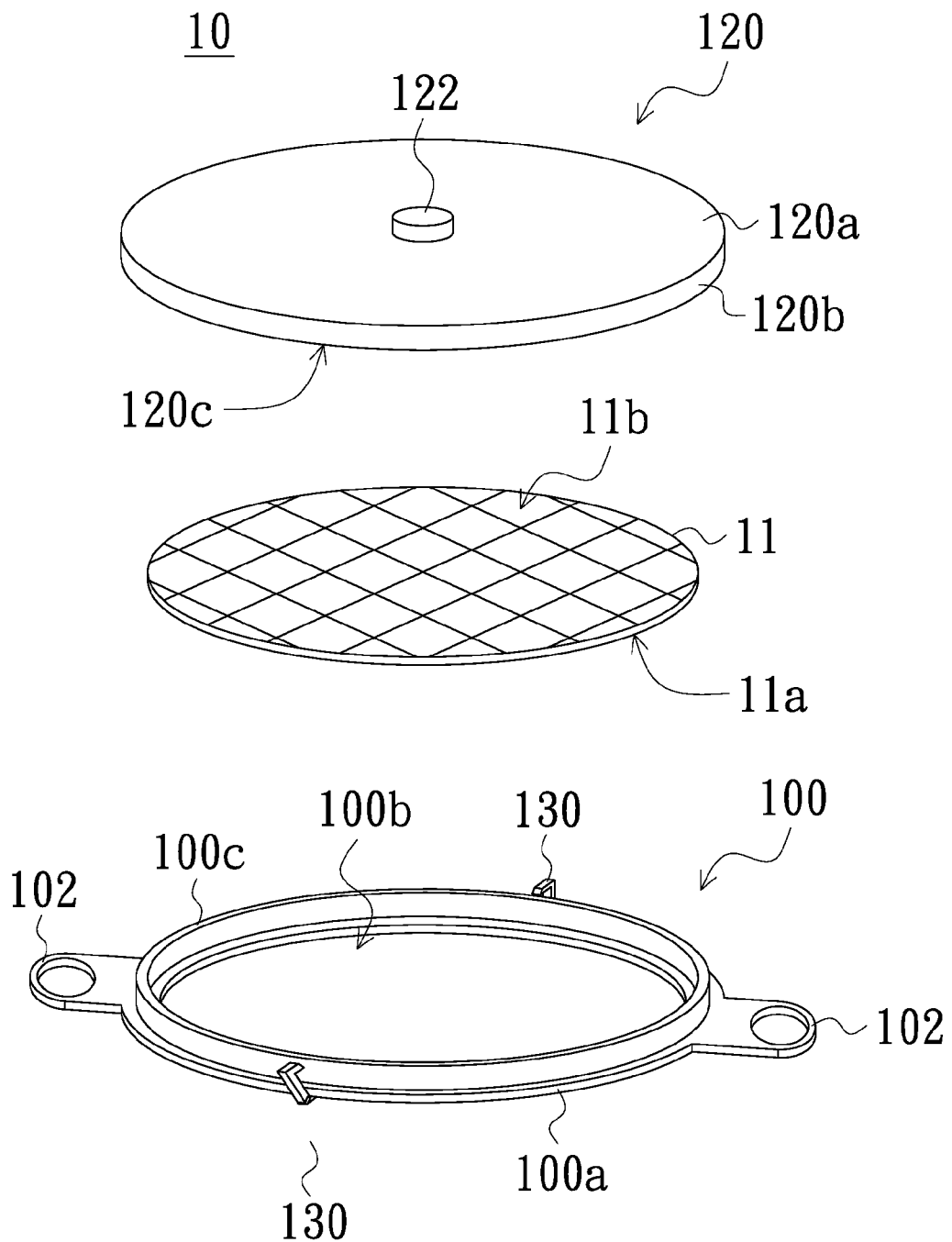
FIG. 1A is an exploded view illustrating a substrate carrier according to one embodiment of the present invention.

FIG. 1A is an exploded view illustrating a substrate carrier 10 according to one embodiment of the present invention. The substrate carrier 10 comprises a supporting element 100 and a cover element 120. The supporting element 100 is used to carry a substrate 11; the cover element 120 is used to be engaged with the supporting element 100, whereby the substrate 11 can be secured between the supporting element 100 and the cover element 120 for performing a deposition process.

In some embodiments, the deposition process may be a physical vapor deposition (PVD) process, a chemical vapor deposition (CVD) process, a sputtering process, a thermal evaporation process, an EBD process or an atomic layer deposition (ALD) process.

The supporting element 100 and the cover element 120 may be composed by materials with thermal resistance. For example, in some embodiments of the present invention, the deposition is carried out in a high temperature substantially ranges from 300☐ to 400☐, thus the supporting element 100 preferably may be a shelf structure made of stainless steel; and the cover element 120 may be composed by metal materials (such as stainless steel) or ceramics. The substrate 11 is preferable a semiconductor wafer, and for the purpose of clearly describing the embodiments, the substrate 11 will be referred as a wafer 11 thereinafter.

Figure 1B:
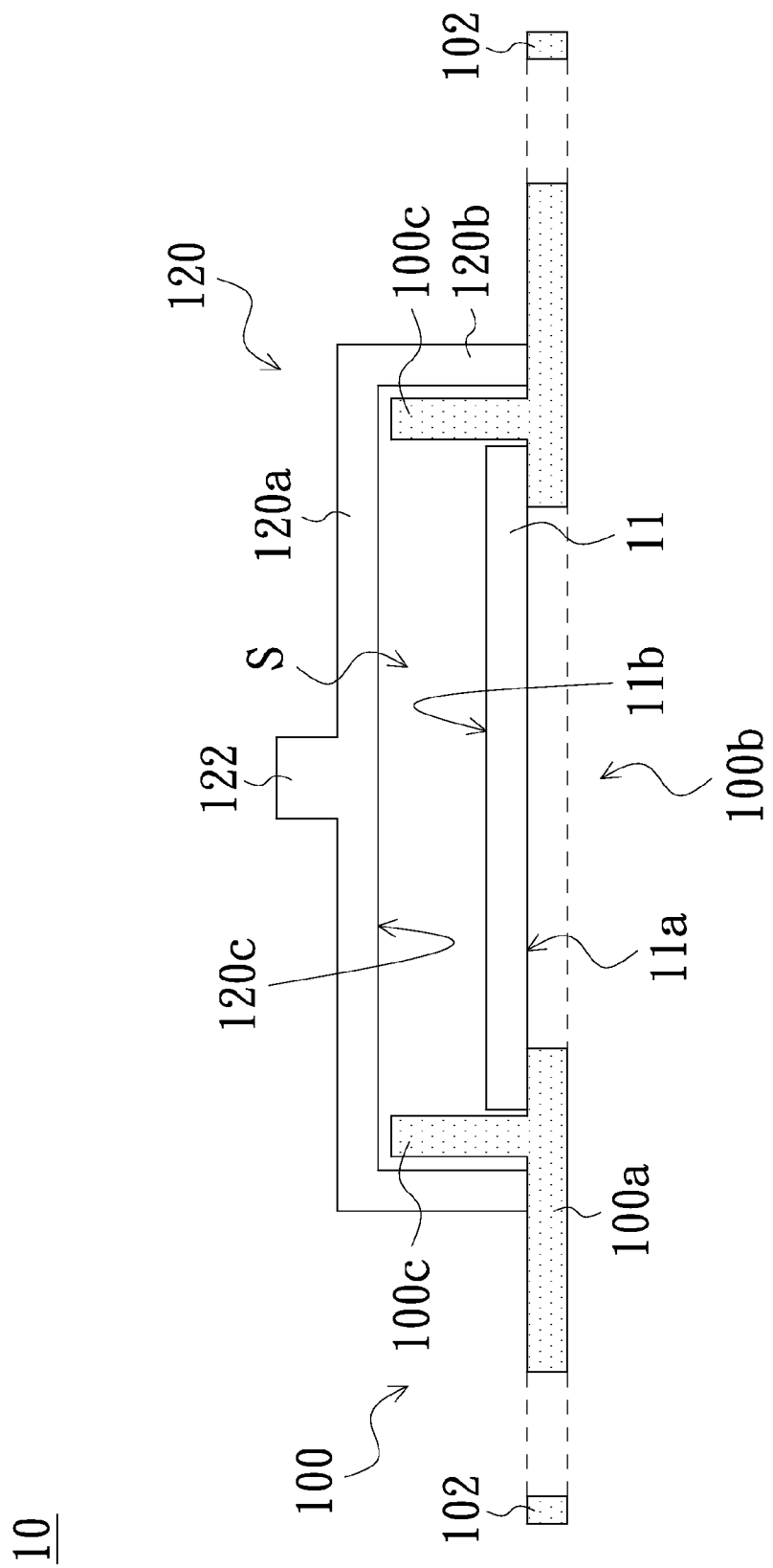
FIG. 1B is a cross section view illustrating the assembly structure of the substrate carrier shown in FIG. 1A.

FIG. 1B is a cross section view illustrating the assembly structure of the substrate carrier 10 shown in FIG. 1A. The supporting element 100 has a base 100a, a through hole 100b and a annular flange 100c, wherein the through hole 100b penetrates through the base 100a, and the annular flange 100c vertically protruding from the base 100a and surrounds the through hole 100b.

In some embodiments of the present invention, the through hole 100b is a circular through hole, and the annular flange 100c is a circular flange 100c. In addition, the annular flange 100c has a diameter substantially greater than that of the wafer 11; and the through hole 100b has a diameter substantially less than that of the wafer 11. Thereby, the wafer 11 can be disposed just on the portion of the base 100a located between the annular flange 100c and the through hole 100b; and a deposition surface 11a of the wafer 11 which is predetermined to be subject to a deposition can be exposed from the through hole 100b. In the present embodiment, the deposition surface 11a is the backside surface of the wafer 11. However, it should be appreciated that the number and shape of the through hole 100b may vary in accordance with the practical need for performing the deposition process. In some other embodiments of the preset invention, a plurality of through holes 100b with different shapes may be formed on the supporting element 100 for performing the deposition process.

For the purpose of convenient delivery and ease of operation, in some embodiments of the present invention, the supporting element 100 can further comprise a handle 102 fixed on the edge of the base 100a, wherein the handle 102 may be an independent element fixed on the edge of the base 100a by welding, clamping, embedding, tong-groove joining, adhering or other appropriate measures. Otherwise, in some other embodiments of the invention, the handle 102 may be a protruding portion extending from the base 100a of the supporting element 100 rather than an independent element.

The cover element 120 has a shielding plate 120a and an annular flange 120b, wherein the annular flange 120b vertically protrudes from the edge of the shielding plate 120a and defines a cover surface 120c on one side of the shielding plate 120a. Similarly, for purpose of convenient delivery and ease of operation, the cover element 120 further comprises a holding rod 122 fixed on a surface of the shielding plate 120a opposite to the cover surface 120c. In some embodiments of the present invention, the holding rod 122 may be an independent element fixed on the surface of the shielding plate 120a by welding, clamping, embedding, tong-groove joining, adhering and other appropriate measures. In some other embodiments of the present invention, the holding rod 122 may be, otherwise, a protruding portion extending from the surface of the shielding plate 120a.

In the embodiments of the present invention, the cover element 120 is used to engage with the supporting element 100 in order to secure the wafer 11 between the supporting element 100 and the cover element 120. In the present embodiment, the way of engaging the supporting element 100 with the cover element 120 is directly disposing the shielding plate 120a of the cover element 120 onto the base 100a of the supporting element 100, whereby the cover surface 120c of the cover element 120 can confront the wafer 11 disposed on the base 100a of the supporting element 100.

Since the annular flange 120b of the cover element 120 used to define the cover surface 120c has a size substantially greater than that of the annular flange 100c of the supporting element 100, in the present embodiment, thus when the cover element 120 is engaged with the supporting element 100, the cover surface 120c of the cover element 120 can extend beyond the area surrounded by annular flange 100c, so as to thoroughly cover the wafer 11 which is disposed on the base 100a.

In addition, because the protruding length of the annular flange 120b extending from the shielding plate 120a is grater than the protruding length of the annular flange 100c extending from the base 100a, thus when the cover element 120 is engaged with the supporting element 100, the annular flange 120b may get in touch with the portion of the base 100a beyond the outer edge of the annular flange 100c, and thereby a space S substantial airtight can be defined by the annular flange 120b, the cover surface 120c of the cover element 120, the base 100a of the supporting element 100 and an active surface 11b (opposite to the deposition surface 11a) of the wafer 11.

However, in some other embodiments of the present invention, the protruding length of the annular flange 120b extending from the shielding plate 120a may be less than the protruding length of the annular flange 100c extending from the base 100a, thus when the cover element 120 is engaged with the supporting element 100, the annular flange 100c may get in touch with the cover surface 120c surrounded by the annular flange 120b.

When the deposition surface 11a of the wafer is subject to a deposition process, the active surface 11b of the wafer 11 which is seal with in the space S should not be contaminated by the deposition vapor and wafer discoloration may not occur, and thereby the production yield of the semiconductor devices form on the active surface 11b of the wafer 11 may be increased. This is because that the active surface 11b of the wafer 11 is shielded by the annular flange 120b of the cover element 120 and the base 100a of the supporting element 100, thus the deposition vapor can be prevented from getting in touch with the active surface 11b of the wafer 11.

However, it should be appreciated that, the main function of the substrate carrier 10 is to shield the active surface 11b of the wafer 11 from being contaminated by the deposition vapor. Such that, only if the active surface 11b of the wafer 11 can be effectively shielded, the space S defined by the supporting element 100, the cover element 120 and the active surface 11b of the wafer 11 may not be essentially airtight. In some embodiments of the present invention, the annular flange 120b of the cover element 120 may have at least one gap (not shown).

In addition, since the annular flange 100c of the supporting element 100 and the annular flange 120b of the cover element 120 are designed in corresponding to the profile of the substrate (wafer 11), thus the annular flanges 100c and 120b is generally designed as a ring-like structure having a cross section identical with the profile of the substrate. For example, in the present embodiment, the annular flanges 100c and 120b has a circular cross section identical to the circular profile of the wafer 11. Otherwise, in some other embodiments, the cross section of the annular flanges 100c and 120b may be designed as non-circular (not shown).

Besides, for the purpose of securing the cover element 120 on the supporting element 100, the substrate carrier 10 further comprises at least one fastening element 130 (see FIG. 1A) The fastening element 130 may be a turnbuckle, a nut and bolt, a clamp or other suitable elements. In the present embodiment, the fastening element 130 is a turnbuckle pivoted on the edge of the base 100a of the supporting element 100 (shown in FIG. 1A), by which the shielding plate 120a of the cover element 120 can be hooked up with the supporting element 100.

Figure 2:
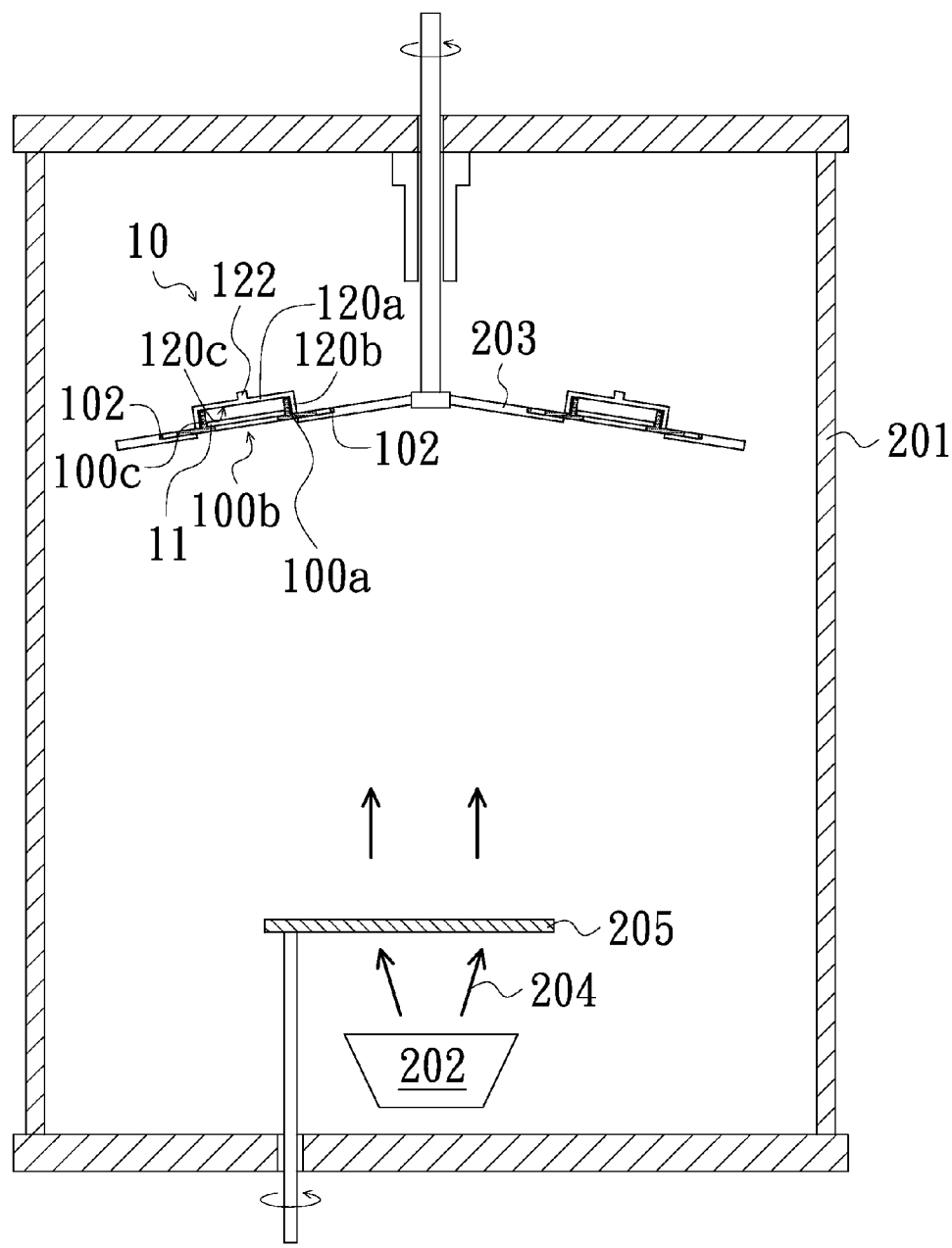
FIG. 2 illustrates a cross sectional view of an apparatus for performing a deposition according to one embodiment of the present invention.

FIG. 2 illustrates a cross sectional view of an apparatus 200 for performing a deposition according to one embodiment of the present invention. The apparatus 200 comprises a cabinet 201, a plurality of substrate carriers 10 and a deposition source 202. The substrate carriers 10 are disposed on a hanger bracket 203 built in the cabinet 201. The deposition source 202 is disposed in the bottom of the cabinet 201 used to provide a deposition vapor 204, such as metal source vapor, during the deposition process.

For the purpose of even dispersing the deposition vapor 204, in some embodiments, the apparatus 200 further comprises at least one rotatable shutter 205, whereby the concentration of the deposition vapor 204 pervaded with in the cabinet 201 can be well controlled. In addition, a plurality of different deposition sources may be disposed in the cabinet 201 and a plurality of the rotatable shutters 205 are also applied, thereby the deposition source 202 desired to be used for the deposition process can be selected by controlling the on-and-off of the corresponding rotatable shutters 205.

The method for performing the deposition process by utilizing the apparatus 200 comprises steps as follows: An apparatus 200 shown in FIG. 2 is firstly provided, wherein the apparatus 200 comprises a cabinet 201, a plurality of substrate carriers 10 and a deposition source 202. Each of the substrate carrier 10 comprises a cover element 120 and a supporting element 100 having a base 100a and a through hole 100b passing through the base 100a. The deposition source 203 is also disposed in the cabinet 201.

A wafer 11 is subsequently disposed on the supporting element 100 in order to make a deposition surface 11a of the wafer 11 exposed from the through hole 100b. The cover element 120 is then engaged with the supporting element 100 to secure the wafer 11 between the supporting element 100 and the cover element 120. Next a deposition vapor 204 is provided from the deposition source 203, whereby the deposition vapor 204 can get in touch with the deposition surface 11a of the wafer 11 which is exposed from the through hole 100b, and meanwhile a metal thin film (not shown) can be formed on the deposition surface 11a of the wafer 11.

In accordance with aforementioned embodiments, the present invention provides a substrate carrier used for performing a deposition. The substrate carrier comprises a supporting element and a cover element, when the supporting element and the cover element are engaged with each other; a substrate can be secured therebetween.

By using the cover element as a shielding mask to prevent the surfaces of the substrate which are undesired to be subject to a thin-film deposition process from getting in touch with the deposition vapor, the undesired contaminations and discoloration occurring on the substrate may be avoided and the production yield of the integrated semiconductor devices formed on the substrate may be improved.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A substrate carrier for performing a deposition process, comprising:
    a supporting element, having a through hole and used to carry a substrate, the supporting element comprising:
        a base, through which the through hole penetrates; and
        a first annular flange, vertically protruding from a top surface of the base and surrounding the through hole; and
    a cover element, removably engaged with the supporting element to secure the substrate therebetween and expose a deposition surface of the substrate from the through hole.

2. The substrate carrier according to claim 1, wherein the first annular flange has a size substantially greater than that of the substrate, and the through hole has a size substantially less than that of the substrate.

3. The substrate carrier according to claim 2, wherein the cover element comprises:
    a shielding plate, having a cover surface used to confront with the substrate; and
    a second annular flange, protruding from the shielding plate, surrounding the cover surface and having a size substantially greater than that of the first annular flange.

4. The substrate carrier according to claim 3, wherein when the cover element is engaged with the supporting element to secure the substrate therebetween, the second annular flange can get in touch with the base, and whereby a space substantially airtight can be defined between the cover element, the supporting element and the substrate.

5. The substrate carrier according to claim 3, further comprising:
    a handle, fixed on an edge of the supporting element; and
    a holding rod, fixed on a surface of the cover element opposite to the cover surface.

6. The substrate carrier according to claim 5, wherein the handle is a protruding portion extending from the supporting element, and the holding rod is a protruding portion extending from the cover element.

7. The substrate carrier according to claim 1, further comprising a fastening element used to secure the cover element on the supporting element.

* * * * *